(12) United States Patent
Myung

(10) Patent No.: US 7,371,507 B2
(45) Date of Patent: May 13, 2008

(54) METHODS FOR FABRICATING SEMICONDUCTOR DEVICES

(75) Inventor: Jung Hak Myung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/909,690

(22) Filed: Aug. 2, 2004

(65) Prior Publication Data

US 2005/0026085 A1    Feb. 3, 2005

(30) Foreign Application Priority Data

Aug. 2, 2003    (KR) .................. 10-2003-0053636

(51) Int. Cl.
*G03F 7/26* (2006.01)
(52) U.S. Cl. ...................... 430/316; 430/329
(58) Field of Classification Search ............... 430/311, 430/313, 314, 316, 317, 329; 438/710, 711, 438/717; 134/1.1
See application file for complete search history.

(56) References Cited

U.S. PATENT DOCUMENTS

| | | | |
|---|---|---|---|
| 6,063,709 A * | 5/2000 | Kuo et al. .............. | 438/710 |
| 6,380,096 B2 * | 4/2002 | Hung et al. ............. | 438/723 |
| 6,399,483 B1 | 6/2002 | Liu et al. ............... | 438/638 |
| 6,630,407 B2 | 10/2003 | Keil et al. .............. | 438/717 |
| 6,720,256 B1 | 4/2004 | Wu et al. ............... | 438/638 |
| 2001/0040145 A1 * | 11/2001 | Willson et al. ......... | 216/52 |
| 2003/0164354 A1 * | 9/2003 | Hsieh et al. ........... | 216/22 |

FOREIGN PATENT DOCUMENTS

| KR | 10-2001-0059539 | 7/2001 |
|---|---|---|
| KR | 10-2003-0002119 | 1/2003 |

* cited by examiner

*Primary Examiner*—Kathleen Duda
(74) *Attorney, Agent, or Firm*—Saliwanchik, Lloyd & Saliwanchik

(57) ABSTRACT

Methods for fabricating semiconductor devices are disclosed. A disclosed method comprises: forming a conductive layer, depositing a interlayer dielectric layer, forming an anti-reflective coating layer on the interlayer dielectric layer, forming a photoresist pattern on the anti-reflection layer, dry-etching the anti-reflective coating layer and the interlayer dielectric layer using the photoresist pattern as a mask and performing an Ar and fluoric plasma treatment to remove a residual layer deposited during the etching of the ARC layer and the ILD.

13 Claims, 4 Drawing Sheets

METHODS FOR FABRICATING SEMICONDUCTOR DEVICES

FIELD OF THE DISCLOSURE

The present disclosure relates generally to semiconductor fabrication and, more particularly, to methods for fabricating a semiconductor devices.

BACKGROUND

As the degree of integration in semiconductor devices has advanced, the miniaturization of interconnects has also rapidly proceeded. As an interconnect becomes more miniaturized, the resistance of the interconnect increases and signal transfer delay occurs. Thus, multi-layer interconnects are sometimes adopted instead of single layer interconnects to prevent or reduce signal transfer delay. However, multi-layer interconnects also have a problem. In particular, as the pitch between interconnects decreases, parasitic capacitance between interconnects which are placed at the same level increases, which results in an increase in signal transfer delay. In the case of a fine interconnect, the signal transfer delay caused by the parasitic capacitance between the interconnects enormously affects the operation characteristic of the semiconductor device.

The thickness of the interconnect may be decreased and the thickness of the interlayer dielectric layer (hereinafter referred to as "ILD") may be increased to diminish the parasitic capacitance between the interconnects. Further, the interconnect should be made of a material with low specific resistance and the ILD should be made of a material with a low dielectric constant. For example, copper is sometimes used to make the interconnect and various materials are used to form the ILD. Furthermore, several methods are provided to fabricate the ILD with various materials. However, it is difficult to use copper in dry-etching due to the low vapor pressure of the residual products.

Thus, a damascene process has been developed to fabricate a copper interconnect. In brief, the damascene process comprises the following. Holes such as via holes and contact holes are formed. Next, the holes are filled with copper. A planarization process is then carried out. The damascene process requires an etch-stop layer during a Chemical Mechanical Polishing (hereinafter referred to as "CMP") process for the planarization of the copper. Because the dielectric constant of the ILD increases proportionally to the dielectric constant of the etch-stop layer, materials with thin thickness and low dielectric constant are preferably used to form the etch-stop layer. At present, nitride is usually used to make the etch-stop layer.

If an end point detection(hereinafter referred to as EPD) system employing an optical emission spectroscopy method is used during the CMP process, the etching end point of the interconnect material is detected after a nitride layer is already exposed to an etching gas. As a result, the etch-stop layer is unintentionally etched. Thus, if the thickness of the etch-stop layer is thin, the thickness of the etch-stop layer will become thinner due to this etching, and the etch-stop layer will be readily damaged. Therefore, an EDP system employing a laser interferometer is preferably used. This EDP system can prevent damage to the etch-stop layer by terminating the etching of the interconnect material before the etch-stop layer is exposed by the etching gas. Consequently, because a thin etch-stop layer can be used, the dielectric constant of the ILD, as well as the etch-stop layer, can be diminished.

Nowadays, a dual damascene process which improves the conventional damascene process is often performed.

FIG. 1a through FIG. 1d are cross-sectional views illustrating a prior art process for fabricating a semiconductor device. Referring to FIG. 1a, the conventional dual damascene process comprises the following. First, a conductive layer 11 is deposited on the substrate 10. Next, an etch-stop layer 13 is formed on the conductive layer 11. The etch-stop layer 13 and the conductive layer 11 are formed in accordance with a desired pattern for the interconnect. Next, an ILD 15 is formed over the substrate 10 and the etch-stop layer 13. The ILD 15 is then planarized through a CMP process. Next, a via hole 16 is formed in the ILD 15. An anti-reflective coating (hereinafter referred to as ARC) layer 17 is coated on the ILD 15. A photoresist pattern PR is formed on the ARC layer 17 to make an opening 18 vertically placed over the via hole 16.

Referring to FIG. 1b, the ARC layer 17 and the ILD 15 in the opening 18 are dry-etched by using the photoresist pattern PR as a mask. Here, the ILD 15 is etched to a predetermined depth.

Conventionally, while the photoresist pattern for making the trench 19 is being formed, the photoresist pattern is not precisely formed due to the diffused reflection from the conductive layer. Thus, to avoid the above-mentioned weakness, the ARC layer 17 is formed on the ILD 15. The photoresist pattern PR is then formed over the ARC layer 17. The trench 19 is then made.

However, while the ILD 15 and the ARC layer 17 is being dry-etched with fluoric plasma such as CxFx plasma to fabricate the trench 19, a residual layer 21 comprising polymers is deposited at the upper edge of the via hole 16. The residual layer 21 is a mixture comprising the ARC layer 17, the ILD 15 and polymers which are residual products due to the etching.

Referring to FIG. 1c, the residual layer 21 is not completely removed through an $O_2$ plasma treatment which eliminates the photoresist pattern (illustrated as a dotted line). The residual layer 21 is also not entirely removed through a later cleaning process, which is performed with chemical solution for wet cleaning.

In particular, referring to FIG. 1d, although the residual layer 21 is removed from the upper edge of the via hole 16 during the cleaning process, the residual layer 21 may fall into and remain inside the via hole 16. In such circumstances, the residual layer 21 becomes a defect interfering with the electrical connection, between a conductive layer (not shown) in the trench 19 and the via hole 16 and the conductive layer 11, thereby decreasing the yield of the semiconductor device.

To solve this problem, a methods are provided to prolong the time of the $O_2$ plasma treatment or to use both $O_2$ and CxFx plasma in the process for removing the photoresist pattern PR.

However, an excessive $O_2$ plasma treatment has a negative influence on the quality of the ILD 15. In addition, after the dry-etching process for the ILD 15 is completed in a dry-etching chamber, the resulting structure is moved from the dry-etching chamber to another chamber for removing the photoresist pattern. While the resulting structure is being moved to the other chamber for removing the photoresist pattern, the resulting structure is temporally exposed to the air. Thus, the residual layer 21 exposed to the air is harder to remove because of its inherent characteristics. As a consequence, the residual layer 21 is hardly removed by a plasma treatment using a mixture of an $O_2$ gas and a fluoric gas as well.

Another method for removing the residual layer 21 is to perform a wet cleaning process after the photoresist removal process. However, an ILD 15 with a low dielectric constant easily absorbs moisture. Therefore, the wet cleaning process may cause the characteristics of the ILD 15 to be degraded. Thus, the wet cleaning process is very restrictedly performed and is, therefore, not very effective at removing the residual layer 21.

Liu et al., U.S. Pat. No. 6,399,483, describes a method for creating an interconnect pattern for dual damascene structures. The dual damascene structure is created in two overlying levels of dielectric.

Keil et al., U.S. Pat. No. 6,630,407, describes a semiconductor manufacturing process wherein an organic ARC layer is plasma etched with selectivity to an underlying dielectric layer and/or overlying photoresist.

Wu et al., U.S. Pat. No. 6,720,256, describes a method for patterning photoresist during formation of damascene structures which involves a process that is resistant to poisoning from adjacent layers.

DETAILED DESCRIPTION

Figure 2A:
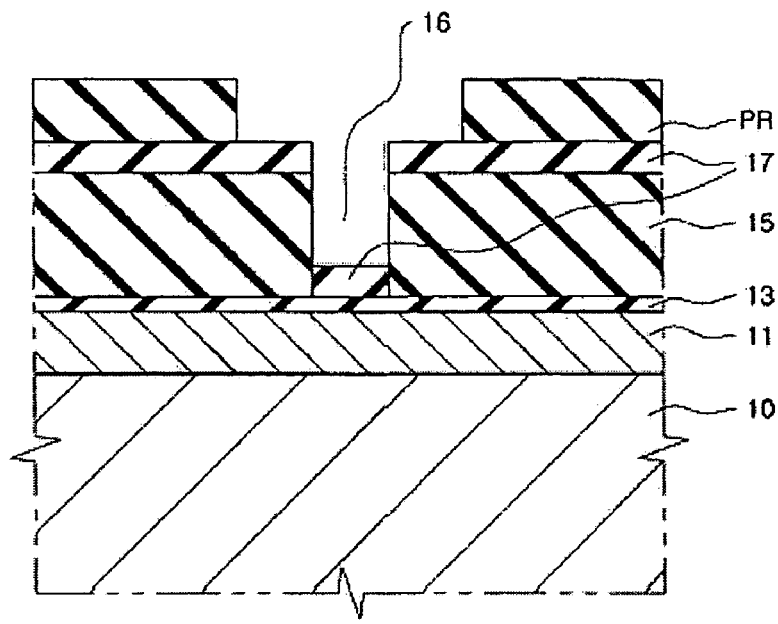
FIG. 2a through FIG. 2c are cross-sectional views illustrating an example process performed in accordance with the teachings of the invention to fabricate a semiconductor device.
Figure 2B:
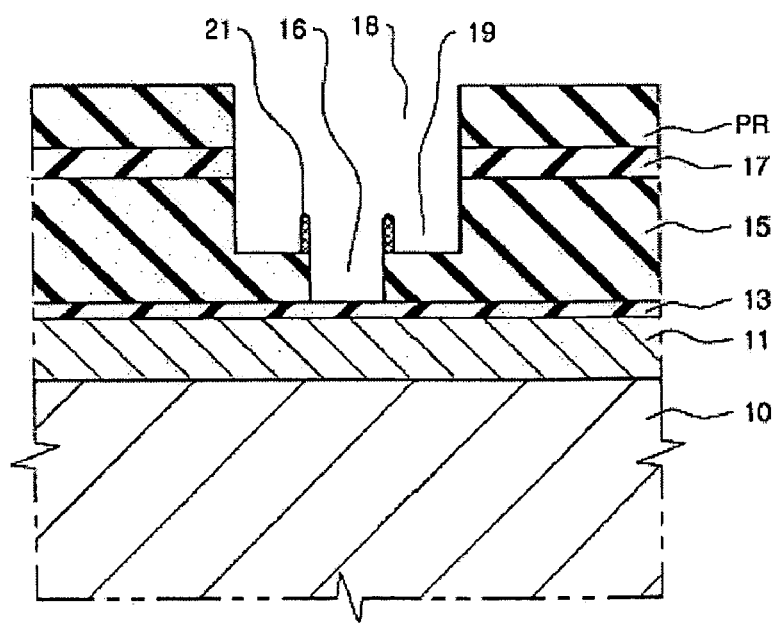
Figure 2C:
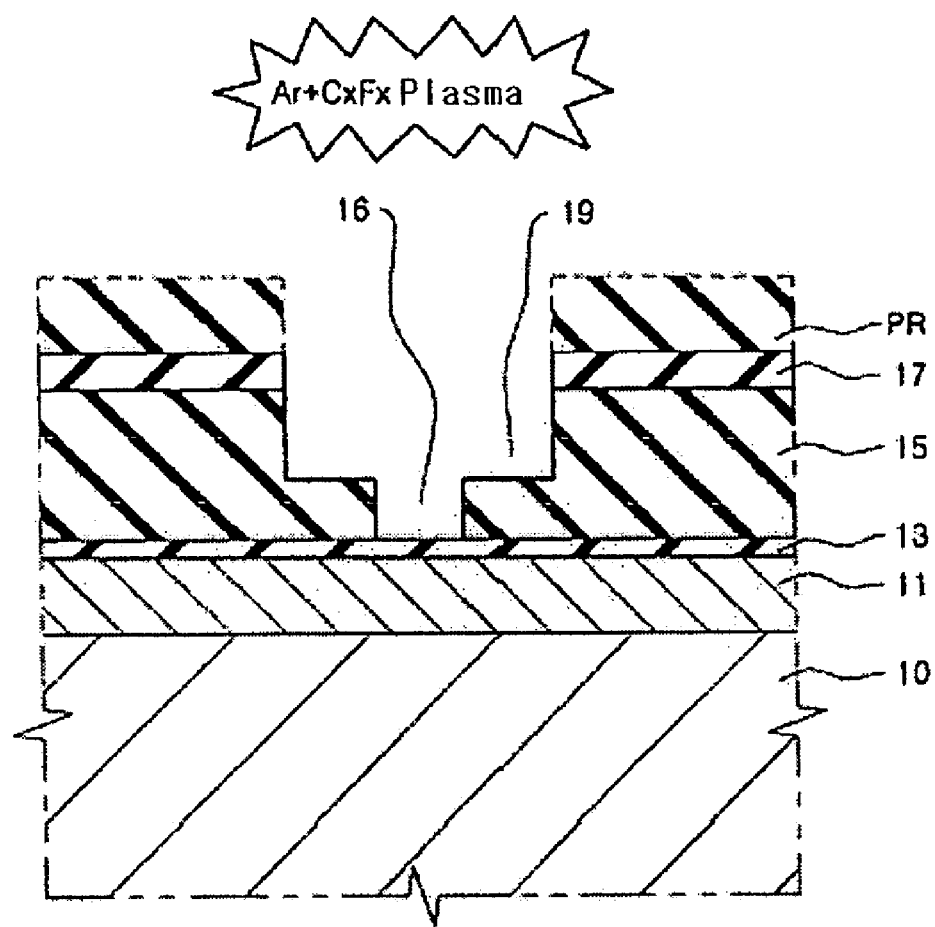

FIG. 2a through FIG. 2c are cross-sectional views illustrating an example process for fabricating a semiconductor device. Referring to FIG. 2a, a substrate 10 is prepared. The substrate 10 of the illustrated example comprises a gate electrode, capacitor, an interconnect and an ILD. Next, a conductive layer 1 with high optic reflectivity such as an aluminum layer is deposited by a sputtering process. An etch-stop layer 13 is then deposited on the conductive layer 11. The etch-stop layer 13 prevents the etching of the conductive layer 11 while an ILD 15 is being etched to form a via hole in the ILD 15. In the illustrated example, the etch-stop layer 13 comprises a material selected from TiN and nitride. Next, the etch-stop layer 13 and the conductive layer 11 are etched in accordance with a predetermined pattern. Next, the ILD 15 is deposited over the resulting structure including the patterned etch-stop layer 13 by means of a chemical vapor deposition process. The ILD 15 is planarized by a CMP process. In the illustrated example, an insulating layer with a low dielectric constant is preferably used as the ILD 15. The ILD 15 is illustrated as a single layer for convenience, but a multi-layer comprising different materials can alternatively be used. Next, a via hole 16 is formed in a predetermined region of the ILD 15. An ARC layer 17 is formed on the ILD 15. The ARC layer 17 is also formed on the inside of the via hole 16. Next, a photoresist pattern PR is formed on the ARC layer 17 to make an opening 18 which is placed vertically over the via hole 16. In the illustrated example, the opening 18 exposes a predetermined portion for forming a trench 19.

Referring to FIG. 2b, the resulting structure is placed into a etching chamber (not shown). Next, the ARC layer 17 is dry-etched using the photoresist pattern PR as a mask. Next, the trench 19 is formed by dry-etching the ILD 15 to a predetermined depth. In the illustrated example, a residual layer 21 comprising polymers is deposited at the upper edge of the via hole 16 while the ARC layer 17 and the ILD 15 are being dry-etched with fluoric plasma such as CxFx plasma. The residual layer 21 is a mixture comprising the anti-reflection layer 17, the ILD 15 and polymers which are residual products produced due to the etching.

Figure 1A:
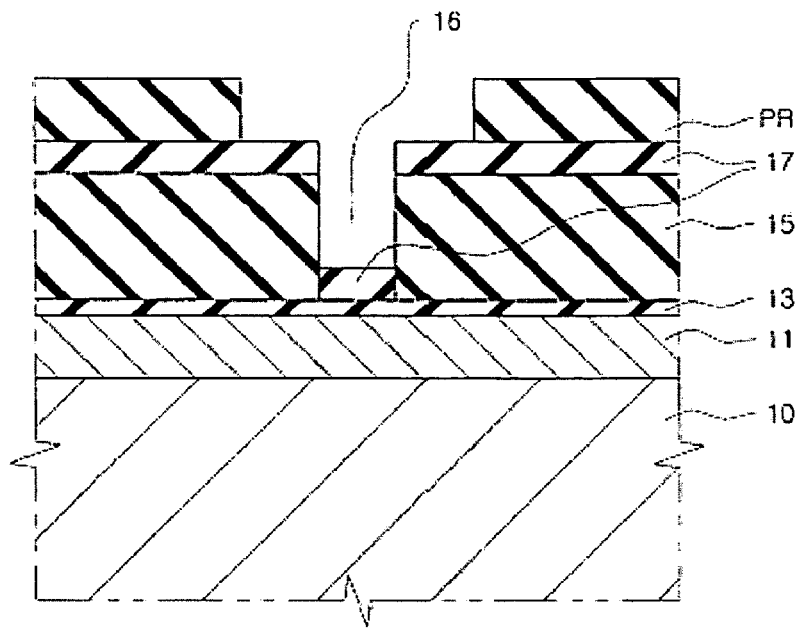
FIG. 1a through FIG. 1d, are cross-sectional views illustrating a prior art process for fabricating a semiconductor device.
Figure 1B:
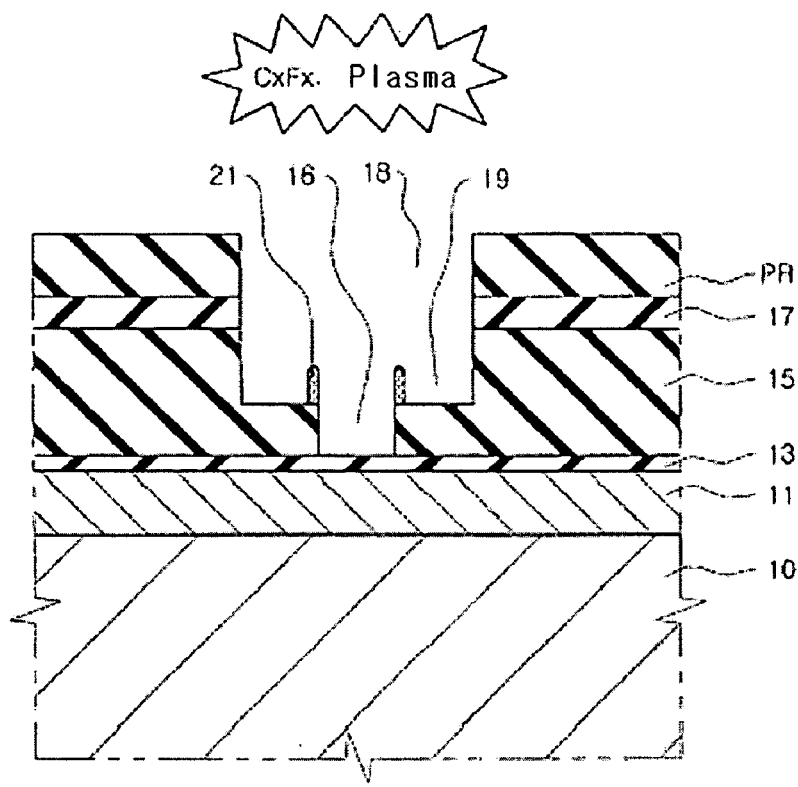
Figure 1C:
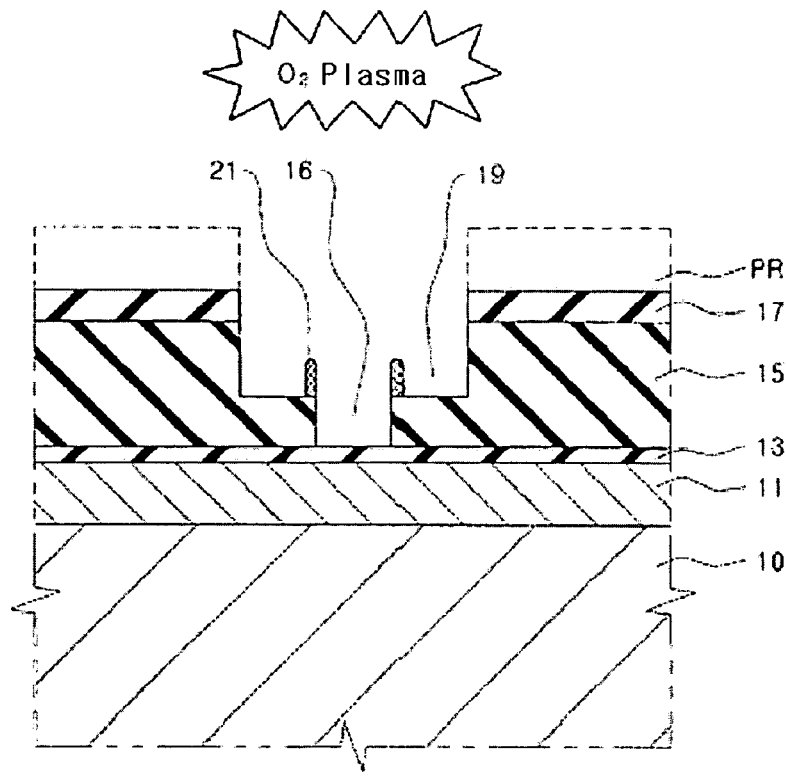
Figure 1D:
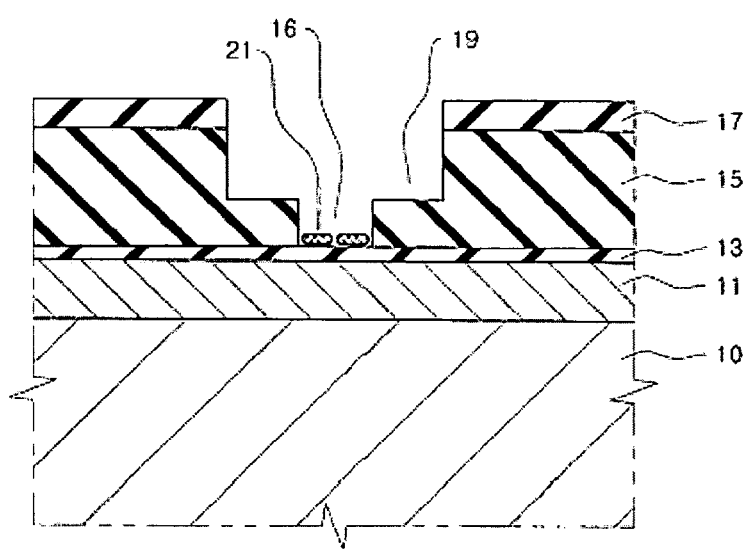

Referring to FIG. 2c, the structure including the trench 19 remains in the etching chamber. The residual layer 21 of FIG. 2c, over the in situ placed structure, is removed by means of Ar and CxFx Plasma. The reason for using Ar and CxFx plasma is to compensate for the weakness of the earlier technology. In the earlier technology, the time of the $O_2$ plasma treatment for removing the residual layer 21 was prolonged. Thus, the condition of the dry-etching for the residual layer 21 was enormously different from the condition of the dry-etching for the ILD 15. Such difference in the dry-etching conditions is highly likely to cause serious defects in the structure which will be subsequently put into the etching chamber. In addition, the earlier technology, which uses $O_2$ plasma or CxFx Plasma to remove the residual layer 21, cannot remove the residual layer 21 comprising solid polymers, (see FIG. 1c), due to the chemical reaction of a radical and an electron.

In contrast, in the method illustrated in FIGS. 2a-2c, the ILD 15 is etched by CxFx plasma, and the residual layer 21 is removed by the Ar and CxFx plasma. Thus, the condition of the etching for the ILD 15 does not differ from the condition of the removal of the residual layer 21. As a result, serious defects in the substrate are prevented by maintaining the same dry-etching condition for the residual layer 21 and the ILD 15.

As mentioned above, Ar and CxFx plasma is used to remove the residual layer 21. During this process, a sputtering effect due to heavy Ar ions occurs and affects the residual layer 21. Therefore, the coherence of the polymers forming the residuals layers 21 is weakened. The residual layer 21 is then readily removed by the chemical reaction of an electron and a radical of the CxFx plasma. As a result, the yield of semiconductor devices produced by the illustrated method is increased. Additionally, because the residual layer 21 is in situ removed, a subsequent wet cleaning process employed in prior art methods for removing the residual layer 21 can be skipped. Therefore, the characteristics of the ILD 15 such as a low dielectric constant are maintained, and the process for fabricating the semiconductor device is simplified.

Moreover, $O_2$ can be added in dependence on the material of the residual layer 21 instead of the CxFx plasma and Ar. For example, a small amount of $O_2$ such as 5~20 SCCM (Standard Cubic Centimeter per Minute) can be added to the Ar and CxFx plasma.

In addition, a large amount of an Ar gas such as 10~50 SCCM is preferably mixed with a small amount of a CxFx gas to form the Ar and CxFx plasma. The loss of the ILD 15 due to the plasma can be minimized to a thickness of less than 200 Å by the illustrated method.

The photoresist pattern PR for forming the trench 19 is removed by a known $O_2$ plasma process. The via hole 16 and trench 19 are then completed for the later damascene process.

The example method illustrated in FIGS. 2a-2c removes the residual layer 21 before the removal of the photoresist pattern PR. However, persons of ordinary skill in the art will appreciate that, in other examples the residual layer 21 may be removed after the photoresist pattern PR is removed.

Accordingly, the disclosed methods readily remove a residual layer 21 deposited during the formation of a trench 19. The illustrated methods can achieve increased yield in fabricating semiconductor devices. Moreover, the illustrated methods can reduce or minimize the damage of the ILD 15 while the residual layer 21 is being removed. In addition, the illustrated methods can maintain characteristics of the ILD 15 such as a low dielectric constant.

From the foregoing, persons of ordinary skill in the art will appreciate that methods for fabricating a copper interconnect have been disclosed. The example method illustrated in FIGS. 2a-2c readily remove a residual layer 21 deposited during the formation of a trench 19 in an ILD 15 for a dual damascene process in situ. The example method also minimizes damage to the ILD 15. Additionally, the example method maintains characteristics of the ILD 15 such as a dielectric constant. Further, the illustrated method achieves an increased yield of semiconductor devices.

The example method shown in FIGS. 2a-2c comprises: forming a conductive layer on a substrate; depositing an ILD; forming an ARC layer on the ILD; forming a photoresist pattern on the ARC layer to expose a predetermined portion of the conductive layer; dry-etching the ARC layer and the ILD by using the photoresist pattern as a mask; and removing in situ a residual layer by a predetermined plasma treatment.

Preferably, a via hole for a dual damascene structure is formed in the ILD, and a trench for a dual damascene structure is formed.

Preferably, the residual layer is removed by an Ar and fluoric plasma treatment. The residual layer may alternatively be removed by an $O_2$, Ar and fluoric plasma treatment.

The residual layer may be removed before or after the photoresist pattern is removed.

It is noted that this patent claims priority from Korean Patent Application Serial Number 10-2003-0053636, which was filed on Aug. 2, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:
    forming a conductive layer;
    depositing an interlayer dielectric layer on the conductive layer;
    forming an anti-reflective coating layer on the interlayer dielectric layer;
    forming a photoresist pattern on the anti-reflective coating layer;
    dry-etching the anti-reflective coating layer and the interlayer dielectric layer in an etching chamber using the photoresist pattern as a mask to expose a predetermined portion of the conductive layer;
    weakening a coherence of a residual layer by performing an Ar plasma treatment using a sputtering effect of the Ar plasma ions in the etching chamber to affect the residual layer deposited during the dry-etching of the anti-reflective coating layer and the interlayer dielectric layer; and
    performing a fluoric based plasma treatment comprising $C_xF_x$ plasma to remove the weakened residual layer, wherein the weakened residual layer is removed by the chemical reaction of an electron with a radical of the $C_xF_x$ plasma.

2. A method as defined by claim 1, further comprising forming a via hole for a dual damascene structure in the interlayer dielectric layer.

3. A method as defined by claim 2, wherein dry-etching the anti-reflective coating layer and the interlayer dielectric layer forms a trench for the dual damascene structure.

4. A method as defined by claim 1, wherein the Ar plasma treatment and the fluoric based plasma treatment comprise adding $O_2$.

5. A method as defined by claim 1, further comprising removing the photoresist pattern.

6. A method as defined by claim 5, wherein the residual layer is removed before the photoresist pattern is removed.

7. A method as defined by claim 5, wherein the residual layer is removed after the photoresist pattern is removed.

8. A method as defined in claim 5, wherein removing the photoresist pattern is performed in the etching chamber.

9. A method as defined by claim 1, wherein no wet cleaning is performed to remove the residual layer.

10. The method as defined by claim 1, wherein the interlayer dielectric layer is etched using the $C_xF_x$ plasma.

11. A method for fabricating a semiconductor device comprising:
    depositing an interlayer dielectric layer on a conductive layer;
    forming an anti-reflective coating layer on the interlayer dielectric layer;
    forming a photoresist pattern on the anti-reflective coating layer;
    dry-etching the anti-reflective coating layer and the interlayer dielectric layer in an etching chamber using the photoresist pattern as a mask to expose a predetermined portion of the conductive layer;
    without removing the exposed conductive layer from the etching chamber, weakening a coherence of a residual layer by performing an Ar plasma treatment using a sputtering effect of the Ar plasma ions in the etching chamber to affect the residual layer deposited during the dry-etching of the anti-reflective coating layer and the interlayer dielectric layer;
    and performing a fluoric based plasma treatment comprising $C_xF_x$ plasma to remove the weakened residual layer, wherein the weakened residual layer is removed by the chemical reaction of an electron with a radical of the $C_xF_x$ plasma.

12. The method as defined by claim 11, wherein the Ar plasma treatment and the fluoric based plasma treatment comprise adding $O_2$.

13. The method as defined by claim 11, wherein the interlayer dielectric layer is etched using the $C_xF_x$ plasma.

* * * * *